US012568713B2

(12) United States Patent

Hu et al.

(10) Patent No.: US 12,568,713 B2
(45) Date of Patent: Mar. 3, 2026

(54) BACK CONTACT SOLAR CELL AND PHOTOVOLTAIC MODULE

(71) Applicant: Trina Solar Co., Ltd., Changzhou (CN)

(72) Inventors: Yunyun Hu, Changzhou (CN); Guangtao Yang, Changzhou (CN); Daming Chen, Changzhou (CN); Yifeng Chen, Changzhou (CN)

(73) Assignee: TRINA SOLAR CO., LTD., Changzhou (CN)

( * ) Notice: Subject to any disclaimer, the term of this patent is extended or adjusted under 35 U.S.C. 154(b) by 62 days.

(21) Appl. No.: 18/673,365

(22) Filed: May 24, 2024

(65) Prior Publication Data

US 2025/0280623 A1    Sep. 4, 2025

(30) Foreign Application Priority Data

Mar. 4, 2024    (CN) .......................... 202410242801.2

(51) Int. Cl.
*H10F 77/20* (2025.01)
*H10F 77/30* (2025.01)
*H10F 77/70* (2025.01)

(52) U.S. Cl.
CPC ......... *H10F 77/219* (2025.01); *H10F 77/311* (2025.01); *H10F 77/315* (2025.01); *H10F 77/703* (2025.01)

(58) Field of Classification Search
CPC .... H10F 77/211; H10F 77/215; H10F 77/219; H10F 77/311; H10F 19/35
See application file for complete search history.

(56) References Cited

U.S. PATENT DOCUMENTS

2014/0090701 A1*    4/2014  Rim ...................... H10F 77/703
                                                    136/258
2015/0303323 A1*   10/2015  Li .......................... B82Y 30/00
                                                    438/98

(Continued)

FOREIGN PATENT DOCUMENTS

CN          202678319 U        1/2013
CN          203859122 U       10/2014

(Continued)

OTHER PUBLICATIONS

English machine translation of Li et al. (CN 208767311) published Apr. 19, 2019.*

(Continued)

*Primary Examiner* — Christina Chern

(57) ABSTRACT

The solar cell includes a substrate, multiple conductive layers and a electrode structure. Two adjacent conductive layers having opposite electric polarities are electrically insulated from each other. The electrode structure includes multiple gate electrodes and multiple gate lines. Gate electrodes with opposite electric polarities are arranged at intervals in a second direction, respective gate lines with opposite electric polarities are arranged at intervals in the first direction, and the multiple gate lines are arranged on respective conductive layers with a same electric polarity. A gate line of the multiple gate lines intersects with a gate electrode of the multiple gate electrodes that has opposite electric polarities at an intersection where the gate line is disconnected. A disconnected gate line is electrically connected by a conductive layer having the same electric polarity, and multiple insulation layers are disposed between the multiple gate electrodes and the respective conductive layers at the intersections.

20 Claims, 4 Drawing Sheets

(56) References Cited

U.S. PATENT DOCUMENTS

| | | | |
|---|---|---|---|
| 2016/0005905 A1* | 1/2016 | Jang | H10F 77/937 |
| | | | 136/244 |
| 2017/0170338 A1 | 6/2017 | Matsuo et al. | |
| 2018/0198011 A1* | 7/2018 | Jeon | H10F 19/80 |
| 2022/0140168 A1 | 5/2022 | Li et al. | |
| 2023/0006083 A1 | 1/2023 | Faes et al. | |
| 2024/0047588 A1 | 2/2024 | Zhang et al. | |

FOREIGN PATENT DOCUMENTS

| | | | |
|---|---|---|---|
| CN | 104269453 A | 1/2015 |
| CN | 105679851 A | 6/2016 |
| CN | 208767311 U | 4/2019 |
| CN | 111628028 A | 9/2020 |
| CN | 111668331 A | 9/2020 |
| CN | 212136463 U | 12/2020 |
| CN | 113725312 A | 11/2021 |
| CN | 115425098 A | 12/2022 |
| CN | 218730966 U | 3/2023 |
| CN | 115954404 A | 4/2023 |
| CN | 116387373 A | 7/2023 |
| CN | 116544287 A | 8/2023 |
| CN | 219917177 U | 10/2023 |
| CN | 220065714 U | 11/2023 |
| CN | 220420587 U | 1/2024 |
| CN | 117558795 A | 2/2024 |
| CN | 117577716 A | 2/2024 |
| CN | 220543926 U | 2/2024 |
| EP | 2709162 A1 | 3/2014 |
| FR | 3026229 A1 | 3/2016 |
| JP | 2004022560 A | 1/2004 |
| JP | 201773552 A | 4/2017 |
| JP | 2023164954 A | 11/2023 |
| WO | 2021241425 A1 | 12/2021 |
| WO | 2023159995 A1 | 8/2023 |

OTHER PUBLICATIONS

Extended European Search Report from corresponding European Application No. EP24178680.5, dated Nov. 12, 2024.

Hendrichs Max et al. "Screen-Printed Metallization Concepts for Large-Area Back-Contact Back Junction Silicon Solar Cells" IEEE Journal of Photovoltaics, IEEE vol. 6, No. 1, Jan. 1, 2016 (Jan. 1, 2016), pp. 374-383, XP011594764.

Rejection Decision dated Jan. 14, 2025 in Patent Family Application No. JP2024-079377. English translation attached.

Hou Shiying et al. "Step-up DC-DC converter based on active switched-inductor network and diode-capacitor multipliers." Electric Machines and Control, vol. 21, No. 7,Jul. 15, 2017(Jul. 15, 2017), p. 24-32.

Ren Bingyan et al. "Research Progress in Back Contact Silicon Solar Cells." Material Review, vol. 22, No. 9, Sep. 15, 2008(Sep. 15, 2008), p. 101-105.

First Office Action from corresponding Chinese Application No. 202410242801.2, dated May 16, 2024. English translation attached.

Grant Notice dated Jun. 5, 2024 received in Chinese Application No. CN202410242801.2. English translation attached.

First Office Action dated Jul. 25, 2024 received in corresponding patent family application No. AU2024203649.

First Office Action dated Aug. 6, 2024 received in corresponding patent family application No. JP2024-079377. English translation attached.

* cited by examiner center section

BACK CONTACT SOLAR CELL AND PHOTOVOLTAIC MODULE

CROSS-REFERENCE TO RELATED APPLICATION

The present application claims the benefit of priority of the Chinese Patent Application No. 202410242801.2 filed on Mar. 4, 2024, which is incorporated herein by reference in its entirety.

FIELD

The present disclosure relates to the technical field of solar cells, and in particularly, to a back contact solar cell and a photovoltaic module.

BACKGROUND

As a sustainable source of clean energy, a solar cell is a device that converts light energy into electrical energy, and has a huge prospect for development. Different from a traditional solar cell with double-sided electrode contact, a back contact solar cell has a metal electrode disposed at a shady surface of the solar cell. Therefore, there is no obstruction on a light-receiving surface of the solar cell, which provides a high light utilization rate, a higher short circuit current, and higher conversion efficiency.

However, a positive electrode and a negative electrode of the back-contact solar cell are disposed at a back surface of the back contact solar cell. Due to a staggered distribution of electrodes of two polarities, the positive electrode and the negative electrode are easily in contact with each other, resulting in a short circuit and an ineffective solar cell.

SUMMARY

In a first aspect, a back contact solar cell is provided according to some embodiments of the present disclosure. The back contact solar cell includes: a substrate and multiple conductive layers disposed at a surface of the substrate and arranged in a first direction. Two adjacent conductive layers of the multiple conductive layers having opposite electric polarities and being electrically insulated from each other. The back contact solar cell further includes an electrode structure arranged at a surface of each of the multiple conductive layers away from the substrate. The electrode structure includes multiple gate electrodes and multiple gate lines intersecting with and electrically connected to the multiple gate electrodes, respective gate electrodes with opposite electric polarities being arranged at intervals in a second direction intersecting with the first direction, respective gate lines with opposite electric polarities being arranged at intervals in the first direction, and the multiple gate lines being arranged on respective conductive layers with a same electric polarity as the multiple gate lines. A gate line of the multiple gate lines intersects with a gate electrode of the multiple gate electrodes that has opposite electric polarities to the gate line at an intersection where the gate line is disconnected to be spaced apart from the gate electrode in the second direction. A disconnected gate line is electrically connected by a conductive layer of the multiple conductive layers having the same electric polarity as the disconnected gate line, and multiple insulation layers are disposed between the multiple gate electrodes and the respective conductive layers at the intersections.

In a second aspect, a photovoltaic module is further provided according to some embodiments of the present disclosure. The photovoltaic module includes at least one back contact solar cell according to the above embodiments.

BRIEF DESCRIPTION OF THE DRAWINGS

The above and/or additional embodiments of the present disclosure will become more apparent and more understandable from the following description of embodiments in conjunction with the accompanying drawings.

Figure 1:
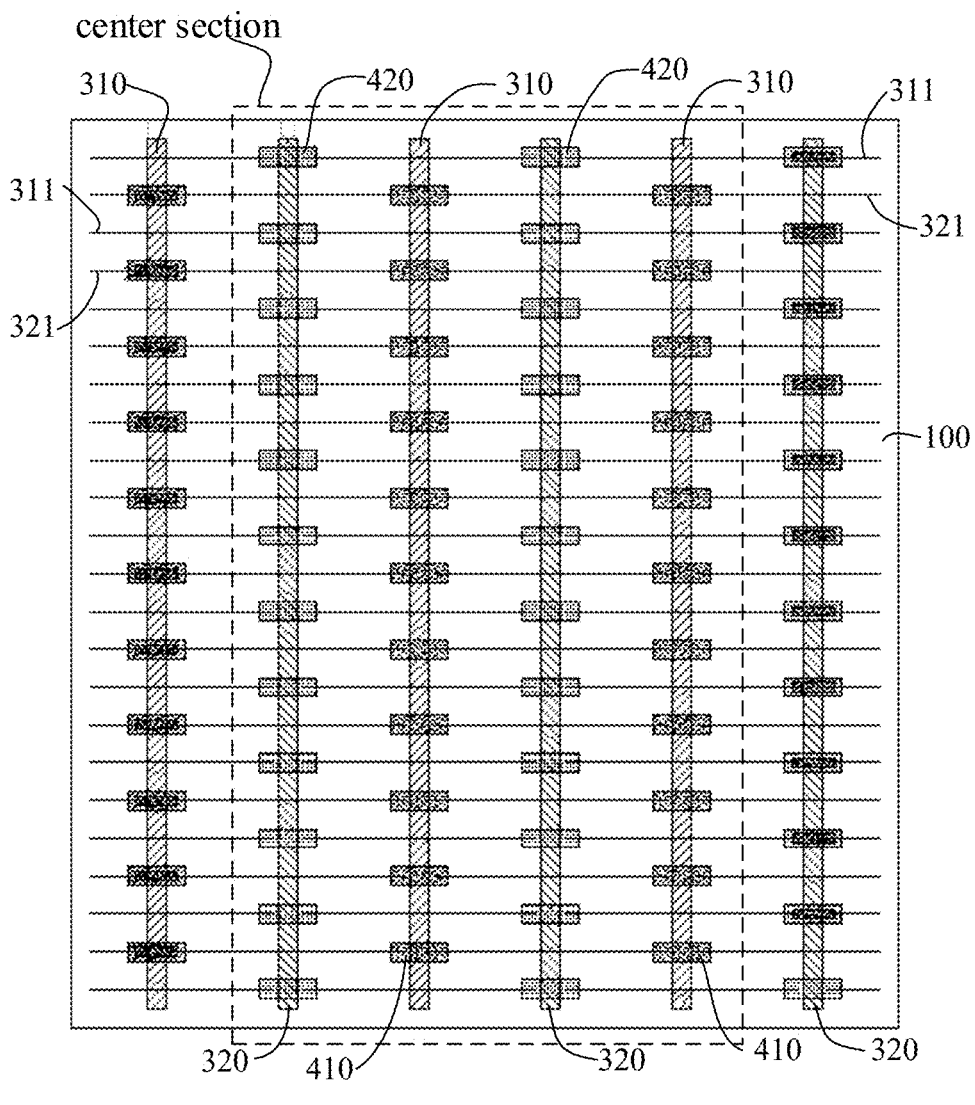
FIG. 1 is a first top view of a back contact solar cell according to an embodiment of the present disclosure.

REFERENCE NUMERALS IN THE ACCOMPANYING DRAWINGS substrate 100; semiconductor substrate 101; first polarity region 102; second polarity region 103; first passivation layer 111; first doped semiconductor layer 112; second passivation layer 121; second doped semiconductor layer 122; third passivation layer 130; antireflection layer 140; insulating material layer 150; first conductive layer 210; second conductive layer 220; first gate electrode 310; first gate line 311; second gate electrode 320; second gate line 321; first insulation layer 410; second insulation layer 420; first connection layer 510; second connection layer 520.

DETAILED DESCRIPTION

Embodiments of the present disclosure will be described in detail below with reference to examples thereof as illustrated in the accompanying drawings, throughout which same or similar elements, or elements having same or similar functions, are denoted by same or similar reference numerals. The embodiments described below with reference to the drawings are illustrative only, and are intended to explain, rather than limiting, the present disclosure.

A back contact solar cell and a photovoltaic module of the embodiments of the present disclosure are described below with reference to the accompanying drawings through specific embodiments and application scenarios thereof.

The present disclosure aims to solve at least one of the problems in the related technologies. To this end, the present disclosure provides a back-contact solar cell and a photovoltaic module, which can prevent electrodes having different polarities from being in contact with each other to cause a short circuit and prevent the solar cell from being ineffective.

In a first aspect, a back contact solar cell is provided according to some embodiments of the present disclosure. The back contact solar cell includes: a substrate and multiple conductive layers disposed at a surface of the substrate and arranged in a first direction. Two adjacent conductive layers of the multiple conductive layers having opposite electric polarities and being electrically insulated from each other. The back contact solar cell further includes an electrode structure arranged at a surface of each of the multiple conductive layers away from the substrate. The electrode structure includes multiple gate electrodes and multiple gate lines intersecting with and electrically connected to the multiple gate electrodes, respective gate electrodes with opposite electric polarities being arranged at intervals in a second direction intersecting with the first direction, respective gate lines with opposite electric polarities being arranged at intervals in the first direction, and the multiple gate lines being arranged on respective conductive layers with a same electric polarity as the multiple gate lines. A gate line of the multiple gate lines intersects with a gate electrode of the multiple gate electrodes that has opposite electric polarities to the gate line at an intersection where the gate line is disconnected to be spaced apart from the gate electrode in the second direction. A disconnected gate line is electrically connected by a conductive layer of the multiple conductive layers having the same electric polarity as the disconnected gate line, and multiple insulation layers are disposed between the multiple gate electrodes and the respective conductive layers at the intersections.

According to the back contact solar cell of the present disclosure, the gate line is disconnected and the insulation layer is arranged at the intersections where the gate electrode intersects to the gate line having opposite electric polarities, which allows the gate line to be spaced apart from the gate electrode. The disconnected gate line is electrically connected by the conductive layer to prevent electrodes having different polarities from being in contact with each other to cause a short circuit and prevent the solar cell from being ineffective. Meanwhile, the consumption of raw materials for electrode can be reduced, and the manufacturing cost of the solar cell can be reduced.

According to an embodiment of the present disclosure, at each of the intersections, a width of each of multiple insulation layers in the second direction is greater than or equal to a width of a corresponding gate electrode in the second direction.

According to an embodiment of the present disclosure, at each of the intersections, the gate line is disconnected by a distance greater than a width of the gate electrode in the second direction.

According to an embodiment of the present disclosure, at each of the intersections, a width of each of multiple insulation layers in the second direction is greater than or equal to a distance by which the gate line is disconnected.

According to an embodiment of the present disclosure, each of the multiple conductive layers has a square resistance ranging from 20 ohm/sq to 1000 ohm/sq.

According to an embodiment of the present disclosure, a connection layer is disposed at the intersections and close to the conductive layer, the connection layer having a smaller square resistance than the conductive layer, the disconnected gate line forming a conductive channel through the connection layer, and the connection layer being spaced apart from the gate electrode by a corresponding insulation layer of the multiple insulation layers.

According to an embodiment of the present disclosure, an area of a projection of each of the multiple insulation layers on the substrate is greater than or equal to an area of a projection of the connection layer on the substrate.

According to an embodiment of the present disclosure, at each of the intersections, a width of the connection layer in the second direction is greater than or equal to a distance by which the respective gate line is disconnected.

According to an embodiment of the present disclosure, the connection layer and the conductive layer are disposed at an intersection at each of two opposite ends of the back contact solar cell in the second direction.

According to an embodiment of the present disclosure, the conductive layer is disposed at the intersection at a center section of the back contact solar cell in the second direction. Or, the connection layer and the conductive layer are disposed at the intersection at the center section of the back contact solar cell in the second direction.

According to an embodiment of the present disclosure, the connection layer includes a conductive metal.

According to an embodiment of the present disclosure, the conductive metal includes silver and/or copper.

According to an embodiment of the present disclosure, the conductive metal is of at least one of nano-, submicron-, and micro-sized.

According to an embodiment of the present disclosure, the square resistance of the connection layer ranges from 0.001 ohm/sq to 10 ohm/sq.

According to an embodiment of the present disclosure, the connection layer has a rectangular, circular, elliptical, or irregular projection on the substrate.

According to an embodiment of the present disclosure, the substrate includes a doped semiconductor layer, a passivation layer, and a semiconductor substrate that are sequentially arranged in a direction away from the multiple conductive layers.

In a second aspect, a photovoltaic module is further provided according to some embodiments of the present disclosure. The photovoltaic module includes at least one back contact solar cell according to the above embodiments.

According to the photovoltaic module of the present disclosure, in the back contact solar cell of the photovoltaic module, the gate line is disconnected and the insulation layer is arranged at the intersection where the gate electrode intersects to the gate line having opposite electric polarities, which allows the gate line to be spaced apart from the gate electrode. The disconnected gate line is electrically connected by the conductive layer to prevent electrodes having different polarities from being in contact with each other to cause a short circuit and prevent the solar cell from being ineffective. Meanwhile, the consumption of raw materials for electrode can be reduced, and the manufacturing cost of the solar cell can be reduced.

Additional embodiments of the present disclosure will be given at least in part in the following description, or become apparent at least in part from the following description, or can be learned from practicing of the embodiments of the present disclosure.

As shown in FIG. 1, the back contact solar cell includes a substrate 100, a conductive layer, and an electrode structure.

The substrate 100 has a surface facing sunlight and a surface facing away from sunlight.

In this embodiment, the conductive layer is disposed at a surface of the substrate 100, i.e., the surface facing away from sunlight. The electrode structure is provided at a surface of the conductive layer away from the substrate 100, i.e., the conductive layer is arranged between the substrate 100 and the electrode structure.

The electrode structure includes gate electrodes and gate lines intersecting with and electrically connected to the corresponding gate electrodes. A cross-sectional area of the gate line may be smaller than a cross-sectional area of the gate electrode, i.e., the gate line is thinner than the gate electrode. The gate line intersecting with and electrically connected to the corresponding gate electrode transmits collected carriers to the gate electrode, and the carriers are output by the gate electrode.

In actual implementation, the electrode structure can be prepared by a conductive metal such as silver and/or copper.

It can be understood that the back contact solar cell includes two types of electrode structures of different electric polarities, which are used to transmit different carriers, respectively.

For example, as shown in FIG. 1, the back contact solar cell includes a first electrode structure and a second electrode structure with opposite electric polarities. The first electrode structure includes a first gate electrode 310 and a first gate line 311. The second electrode structure includes a second gate electrode 320 and a second gate line 321.

The first gate line 311 intersects with and is electrically connected to the first gate electrode 310, and transfers collected carriers to the first gate electrode 310. The second gate line 321 intersects with and is electrically connected to the second gate electrode 320, and transfers collected carriers to the second gate electrode 320.

In this embodiment, the back contact solar cell includes two types of conductive layers with opposite electric polarities. Multiple conductive layers are arranged in a first direction. Adjacent conductive layers have opposite electric polarities and are electrically insulated from each other.

The first direction is a direction of a plane at which the substrate 100 is located.

For example, the back contact solar cell includes a first conductive layer 210 and a second conductive layer 220 with opposite electric polarities. The first conductive layer 210 and the second conductive layer 220 are spaced apart from each other from top to bottom at the substrate 100 in the first direction. The conductive layers with opposite electric polarities are electrically insulated from each other, which prevents recombination of different carriers.

In actual implementation, the conductive layers with opposite electric polarities can be electrically insulated from each other by a separation in a physical location, e.g., by providing an isolated opening between the first conductive layer 210 and the second conductive layer 220.

In this embodiment, the gate electrodes with opposite electric polarities are arranged at intervals in a second direction intersecting the first direction. The gate lines with opposite electric polarities are arranged at intervals in the first direction. The gate lines are located at the conductive layers of the same electric polarity as the gate lines.

The second direction is a direction at a plane at which the substrate 100 is located, and the second direction intersects the first direction.

In actual implementation, the second direction and the first direction may be perpendicular to each other.

As shown in FIG. 1, the back contact solar cell includes the first gate electrode 310 and the second gate electrode 320 with opposite electric polarities. The first gate electrode 310 and the second gate electrode 320 are spaced apart from each other from left to right at the substrate 100 in a second direction. The first gate line 311 and the second gate line 321 with opposite electric polarities are spaced apart from each other from top to bottom at the substrate 100 in the first direction.

The gate line is located at the conductive layer of the same electric polarity as the gate line. The conductive layer can collect carriers generated by the substrate 100 and transmit the carriers to the gate line, and then the collected carriers are transmitted to the gate electrode by the gate line.

It should be noted that the gate electrodes and the gate lines of the electrode structure are arranged in the first direction and the second direction intersecting the first direction, respectively. The gate electrode and the gate line of the same electric polarity as the gate electrode are intersected and connected to each other. The gate electrode and the gate line with opposite electric polarities are insulated to avoid a short circuit of the solar cell.

In this embodiment, a gate line of the multiple gate lines intersects with a gate electrode of the multiple gate electrodes that has opposite electric polarities to the gate line at an intersection where the gate line is disconnected to be spaced apart from the gate electrode in the second direction. A disconnected gate line is electrically connected by the conductive layer of the same electric polarity as the disconnected gate line. An insulation layer is arranged between the corresponding gate electrode and the conductive layer at the intersection.

Figure 2:
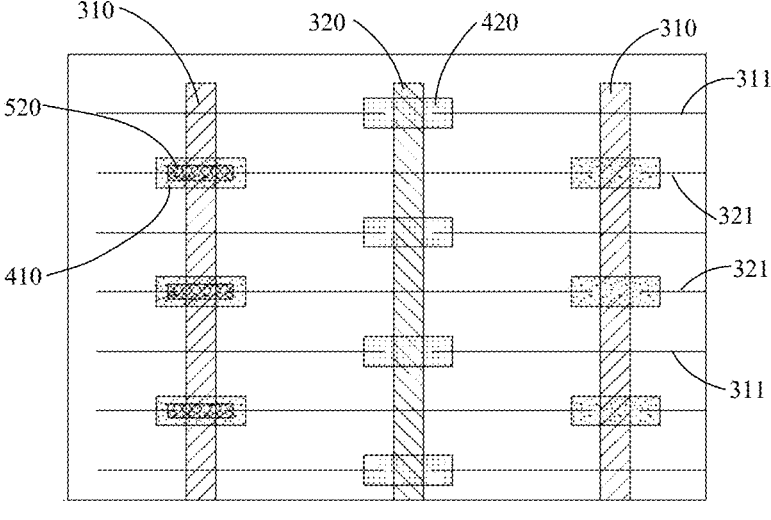
FIG. 2 is a second top view of a back contact solar cell according to an embodiment of the present disclosure.

For example, as shown in FIG. 2, the second gate electrode 320 intersects the first gate line 311 at an intersection. At the intersection, the first gate line 311 is disconnected and spaced apart from the second gate electrode 320 in the second direction.

The first gate electrode 310 intersects the second gate line 321 at an intersection. At the intersection, the second gate line 321 is disconnected and spaced apart from the first gate electrode 310 in the second direction to avoid the gate line and the gate electrode with opposite electric polarities being in contact with each other.

The insulation layer of the back contact solar cell includes a first insulation layer 410 and a second insulation layer 420, which are respectively disposed at different intersections.

Figure 3:
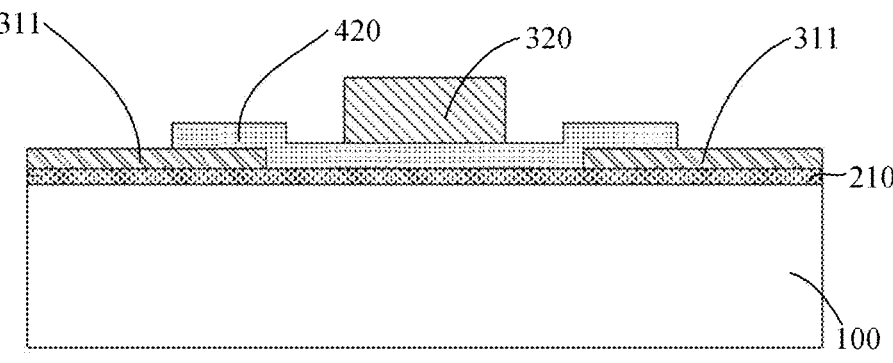
FIG. 3 is a first sectional view of an intersection of a back contact solar cell according to an embodiment of the present disclosure.

For example, as shown in FIG. 3, the first gate line 311 is disconnected at the intersection with the second gate electrode 320. The disconnected first gate line 311 is electrically connected through the first conductive layer 210 of the same electric polarity as the first gate line 311. The second insulation layer 420 is provided at the second gate electrode 320 and the first conductive layer 210 to prevent the second gate electrode 320 from contacting the first conductive layer 210.

Figure 5:
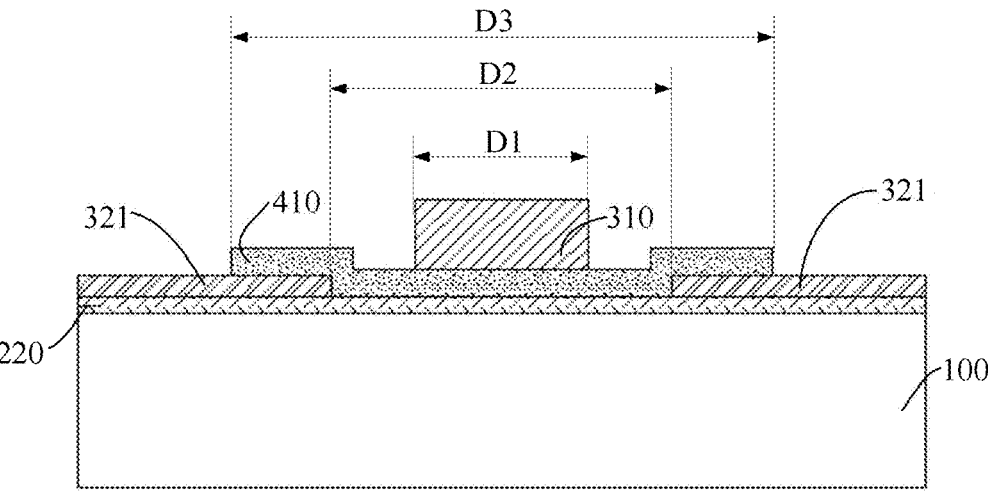
FIG. 5 is a third sectional view of an intersection of a back contact solar cell according to an embodiment of the present disclosure.

As shown in FIG. 5, the second gate line 321 is disconnected at the intersection with the first gate electrode 310. The disconnected second gate line 321 is electrically connected through the second conductive layer 220 of the same electric polarity as the second gate line 321. The first insulation layer 410 is provided at the first gate electrode 310 and the second conductive layer 220 to prevent the first gate electrode 310 from contacting the second conductive layer 220.

In actual implementation, the insulation layer arranged between the conductive layer and the gate electrode may be prepared by insulating glue, insulating ink, and the like.

In the related technologies, a low temperature silver paste is printed by silk-screen printing and sintered at a temperature of about 200° C. to form electrodes of the back contact solar cell. Silver powder used in the low temperature silver paste is mostly a mixture of flake silver powder and spherical silver powder. The silver powder has a large size span, which leads to a rough appearance, large height fluctuation, and many spikes of a finally formed sub-grid, which easily pierces an insulation layer arranged between a main grid and a sub-grid with opposite electric polarities. Thus, the main grid contacts the sub-grid of the opposite electric polarities to form an electrical connection, resulting in a short circuit and an ineffective solar cell.

Figure 8:
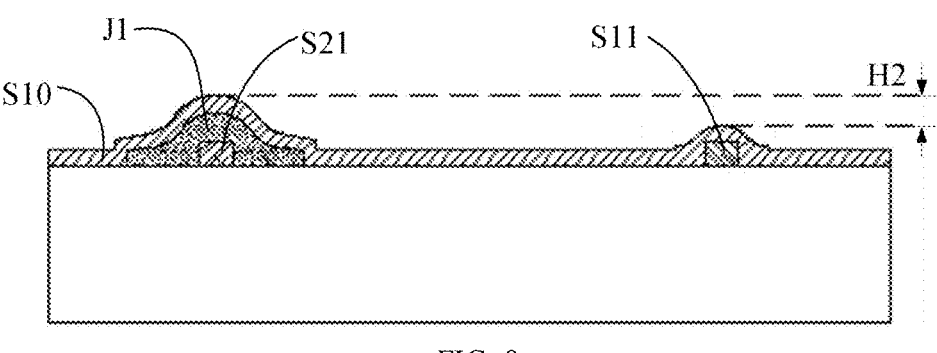
FIG. 8 is a sectional view of a solar cell in the related technologies.

In addition, as shown in FIG. 8, in the related technologies, when a main grid S10 intersects a sub-gate S21 with opposite electric polarities and a sub-gate S11 of the same electric polarity respectively, an insulation layer J1 is disposed between the main grid S10 and the sub-gate S21 with opposite electric polarities, resulting in that a height of the main grid S10 is relatively high. While the main grid S10 contacts the sub-gate S11 of the same electric polarity, the height of the main grid S10 is relatively low. Therefore, there is a height difference H2 at two places of the main grid S10, which is about several tens of microns. The height difference not only affects solar cell testing and serial welding, but also increases silver paste consumption and solar cell manufacturing costs.

In the embodiments of the present disclosure, in the back contact solar cell, the gate electrode intersects the gate line with opposite electric polarities at the intersection. The gate line is disconnected at the intersection, and spaced apart from the gate electrode in the second direction. In this way, a contact between spikes on the gate line and the gate electrode is avoided at a physical position, which solves a short circuit caused by spikes of the low temperature silver paste and prevents the solar cell from being inefficient. The disconnected gate line is electrically connected through a conductive layer of the same electric polarity as the gate line. The conductive layer realizes carrier transmission between two sections of the disconnected gate line. The insulation layer is arranged between the gate electrode of the intersection and the conductive layer to prevent the gate electrode of the opposite electric polarities from contacting the conductive layer and causing a short circuit.

Figure 7:
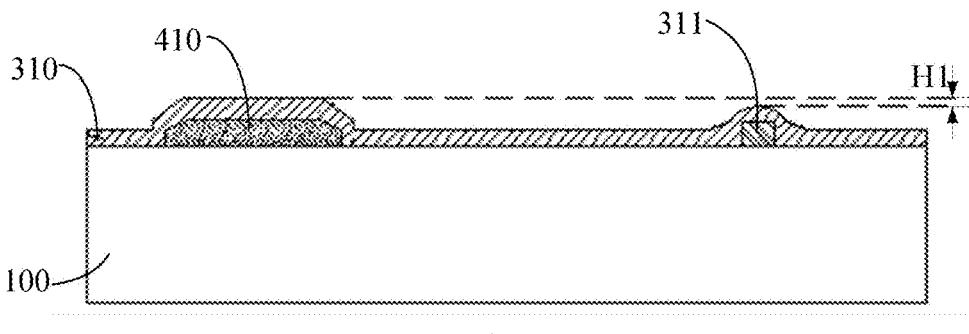
FIG. 7 is a sectional view of a back contact solar cell in a second direction according to an embodiment of the present disclosure.

Additionally, as shown in FIG. 7, in the embodiment of the present disclosure, the first gate electrode 310 is in contact with the first gate line 311 of the same electric polarity as the first gate electrode 31. The first gate line 311 is below the first gate electrode 310. At the intersection where the first gate electrode 310 intersects the second gate line 321 with opposite electric polarities, the second gate line 321 is disconnected. The first insulation layer 410 is below the first gate electrode 310, and a height of the first gate electrode 310 is relatively low. Therefore, a height difference H1 between two positions of the first gate electrode 310 can be effectively reduced, and H1 is smaller than H2. In this way, the consumption of silver paste for the solar cell preparation can be reduced, and the manufacturing cost of the solar cell can be reduced.

According to the back contact solar cell of the embodiments of the present disclosure, the gate line is disconnected, and the insulation layer is arranged between the gate electrode and the conductive layer at the intersection. Therefore, the gate line is spaced apart from the gate electrode, and the disconnected gate line is electrically connected through the conductive layer. In this way, electrodes having different polarities can be prevented from being in contact with each other to cause a short circuit and the solar cell can be prevented from being ineffective. Meanwhile, the consumption of raw materials for electrode preparation can be reduced, and the manufacturing cost of the solar cell can be reduced.

In some embodiments, at the intersection, a width of the insulation layer in the second direction is greater than or equal to a width of the gate electrode in the second direction.

In this embodiment, the insulation layer is arranged between the gate electrode and the conductive layer at the intersection. The width of the insulation layer in the second direction is greater than or equal to the width of the gate electrode in the second direction. Therefore, the insulation layer can effectively prevent the gate electrode from contacting the below conductive layer with opposite electric polarities, and improve the insulation effect of the insulation layer.

For example, as shown in FIG. 5, at the intersection, the width of the first gate electrode 310 in the second direction is D1, and the width of the first insulation layer 410 below the first gate electrode 310 in the second direction is D3. D3 may be greater than or equal to D1. The first gate electrode 310 and the second conductive layer 220 are isolated by the first insulation layer 410, which avoids the first gate electrode 310 contacting the below second conductive layer 220 to cause a short circuit.

In some embodiments, at the intersection, the gate line is disconnected by a distance greater than the width of the gate electrode in the second direction.

In this embodiment, the distance by which the gate line is disconnected is an interval between two ends of the gate line, i.e., a disconnected width of the gate line in the second direction. The distance by which the gate line is disconnected is greater than the width of the gate electrode in the second direction. Therefore, a separating effect between the gate electrode and the gate line of the opposite electric polarities can be improved, and possible contact between the gate electrode and the spikes on the gate line can be avoided. Meanwhile, the disconnected gate line can reduce the silver paste consumption of the electrode structure and reduce the manufacturing costs of the solar cell.

For example, as shown in FIG. 5, at the intersection, the width of the first gate electrode 310 in the second direction is D1, and a distance by which the second gate line 321 is disconnected in the second direction is D2. D2 is greater than D1. The first gate electrode 310 and the second gate line 321 are physically separated to avoid the contact between the gate electrode and the gate line with opposite electric polarities.

In actual implementation, the distance by which the second gate line is disconnected can be adjusted based on conductive performance of a below conductive layer, a position of the gate line, and the like.

For example, the distance by which the gate line is disconnected may be relatively larger for a conductive layer with higher electric polarity and smaller for a conductive layer with lower electric polarity.

In some embodiments, at the intersection, the width of the insulation layer in the second direction is greater than or equal to the distance by which the gate line is disconnected.

In this embodiment, when the width of the insulation layer in the second direction is equal to the distance by which the gate line is disconnected, two ends of the insulation layer are in contact with disconnected ends of the gate line, and the insulation layer is filled between the disconnected ends of the gate line. Therefore, the gate electrode above the insulation layer is spaced apart from the conductive layer below the insulation layer, thereby achieving an insulation effect.

When the width of the insulation layer in the second direction is greater than the distance by which the gate line is disconnected, the insulation layer covers the two disconnected ends of the gate line, i.e., the two disconnected ends of the gate line are wrapped in the insulation layer. The gate electrode above the insulation layer is spaced apart from the conductive layer below the insulation layer, and the disconnected ends of the gate line are wrapped. Therefore, a contact between spikes possibly formed on the gate line and the gate electrode can be prevented, and a short circuit caused by a contact between the disconnected ends of the gate line and a welding strip when components are serially welded can be avoided.

For example, as shown in FIG. 5, at the intersection, the width of the first insulation layer 410 below the first gate electrode 310 in the second direction is D3. The distance by which the second gate line is disconnected 321 is D2, and D3 is greater than or equal to D2. In this way, the gate electrode is effectively prevented from contacting the gate line and the conductive layer, and a short circuit is avoided.

In some embodiments, at the intersection, a width of the insulation layer in the second direction is greater than a distance by which the gate line is disconnected, and the distance by which the gate line is disconnected is greater than the width of the gate electrode in the second direction.

For example, as shown in FIG. 5, at the intersection, the width of the first insulation layer 410 below the first gate electrode 310 in the second direction is D3. The distance by which the second gate line is disconnected 321 is D2, and the width of the first gate electrode 310 in the second direction is D1. D3 is greater than D2, and D2 is greater than D1.

In this embodiment, the insulation layer covers the two disconnected ends of the gate line, and the disconnected distance between the gate line and the gate electrode is greater than the width of the gate electrode. The gate line is spaced apart from the gate electrode in a physical position. The insulation layer can effectively prevent the spikes possibly formed on the gate line from contacting the gate electrode, and can avoid the short circuit caused by the contact between the disconnected ends of the gate line and the welding strip when components are serially welded.

In some embodiments, the conductive layer has square resistance ranging from 20 ohm/sq to 1000 ohm/sq.

The square resistance, also known as sheet resistance, refers to resistance between square conductive materials in ohms per square meter (ohm/sq). The greater the square resistance, the smaller the conductive performance of conductive materials.

In this embodiment, the square resistance of the conductive layer ranges from 20 ohm/sq to 1000 ohm/sq. A conductive layer in this square resistance range can realize the electrical connection between the disconnected gate lines.

In some embodiments, the square resistance of the conductive layer ranges from 100 ohm/sq to 500 ohm/sq.

In this embodiment, a conductive layer in the square resistance ranging from 100 ohm/sq to 500 ohm/sq can achieve stable electrical connection between the disconnected gate lines.

In actual implementation the conductive layer can be prepared from transparent conductive oxides and other materials.

In some embodiments, a connection layer closing to the conductive layer is disposed at the intersection. The connection layer has square resistance smaller than square resistance of the conductive layer. The disconnected gate line is formed as a conductive channel through the connection layer, and the connection layer is spaced apart from the gate electrode by the insulation layer.

It should be noted that the square resistance of the connection layer is smaller than the square resistance of the conductive layer. The conductive performance of the connection layer is better than the conductive performance of the conductive layer. The connection layer is disposed at the intersection, which provides a conductive channel formed by the connection layer and a conductive channel formed by the conductive layer for the disconnected gate line.

The arrangement of the connection layer can increase a current collection range, and the square resistance of the connection layer is small. Therefore, the disconnected gate line can reduce series resistance of the solar cell through the conductive channel formed by the connection layer, which improves the carrier transmission efficiency, reduces the current loss, and effectively improves the photoelectric conversion efficiency of the solar cell.

In this embodiment, at the intersection where the gate electrode insects the gate line of the opposite electric polarities, the connection layer is arranged close to the conductive layer, and the insulation layer is arranged between the connection layer and the gate electrode. The connection layer is spaced apart from the gate electrode by the insulation layer, which effectively prevents the connection layer and the gate electrode and from connecting and causing a short circuit in the solar cell.

Figure 4:
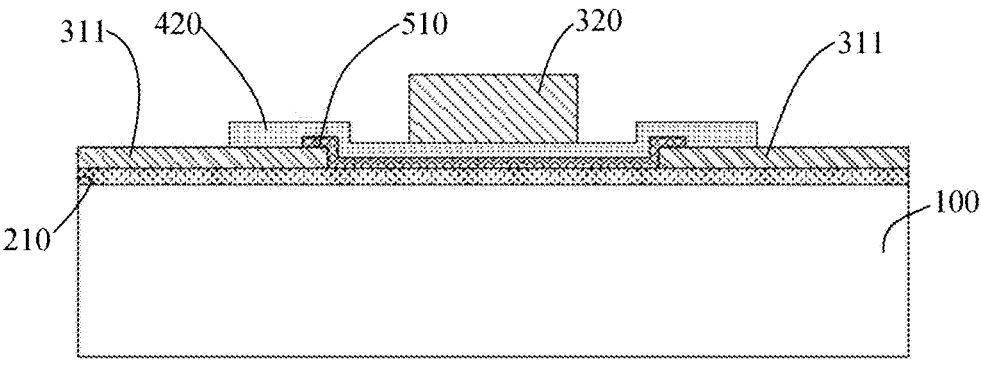
FIG. 4 is a second sectional view of an intersection of a back contact solar cell according to an embodiment of the present disclosure.

For example, as shown in FIG. 4, a first connection layer 510 is disposed at the intersection where the first gate line 311 intersects the second gate electrode 320. The first connection layer 510 is close to the first conductive layer 210, and the second insulation layer 420 is close to the second gate electrode 320.

The disconnected first gate line 311 is formed as a conductive channel through the first connection layer 510, and the disconnected first gate line 311 is further electrically connected through the first conductive layer 210 below the first connection layer 510. The conductive performance of the first connection layer 510 is better than the conductive performance of the first conductive layer 210. The arrangement of the first connection layer 510 can improve stability of an electrical connection between two ends of the disconnected first gate line 311 and improve the carrier transmission efficiency.

In this embodiment, the first connection layer 510 is spaced apart from the second gate electrode 320 by the second insulation layer 420, which prevents the first connection layer 510 and the second gate electrode 320 from contacting and causing a short circuit in the solar cell.

In some embodiments, the square resistance of the connection layer ranges from 0.001 ohm/sq to 10 ohm/sq.

In this embodiment, the square resistance of the connection layer ranges from 0.001 ohm/sq to 10 ohm/sq. The connection layer within the square resistance range forms an effective conductive channel between the disconnected gate lines, which can reduce the series resistance, improve the carrier transmission efficiency of the disconnected gate lines, and improve the photoelectric conversion efficiency of the solar cell.

In actual implementation, the square resistance of the connection layer may range from 0.5 ohm/sq to 1.5 ohm/sq.

In some embodiments, the square resistance of the conductive layer ranges from 20 ohm/sq to 1000 ohm/sq. The square resistance of the connection layer ranges from 0.001 ohm/sq to 10 ohm/sq. The square resistance of the connection layer is smaller than the square resistance of the conductive layer. The connection layer is disposed at the intersection. The disconnected gate line has a conductive channel formed by the conductive layer and a conductive channel formed by the connection layer with better conductive performance, which can improve the photoelectric conversion efficiency of the back contact solar cell.

In some embodiments, the connection layer includes a conductive metal that connects disconnected gate lines to form a conductive channel.

In some embodiments, the conductive metal includes silver and/or copper.

In this embodiment, the electrode structure may be made of metal silver, and the conductive metal may be silver. An electrical connection of the same metal can effectively reduce the transmission loss at the two ends of the disconnected gate electrode and improve the photoelectric conversion efficiency of the solar cell.

It should be noted that the connection layer including conductive metal is disposed below the insulation layer. A size of the conductive metal and the like can be limited. Therefore, there are no large spikes in the formed connection layer and the insulation layer will not be pierced.

In some embodiments, the conductive metal has a size of at least one of nanometer, submicron, and micrometer.

In this embodiment, metal particles, such as a sliver of nanometer and/or submicron and/or micrometer, can be used to prepare the connection layer. Therefore, the disconnected gate lines are connected to form the conductive channel. There are no large spikes in the connection layer, and the insulation layer will not be pierced.

In actual implementation, the connection layer may be prepared by an inkjet printing of nanometer and/or submicron silver metal, and the connection layer may further be prepared by a silk-screen printing of nanometer and/or submicron and/or micrometer silver metal.

In some embodiments, a projection area of the insulation layer on the substrate 100 is greater than or equal to a projection area of the connection layer on the substrate 100.

In this embodiment, the projection area of the connection layer is located in the projection area of the insulation layer, and the projection area of the insulation layer is greater than or equal to the projection area of the connection layer. The insulation layer may cover the connection layer. Therefore, the connection layer forms a conductive channel for the disconnected gate line, and at the same time, the insulation effectiveness between the gate electrode and the connection layer is improved to avoid the short circuit of the solar cell.

In actual implementation, on the substrate 100, the projection area of the insulation layer is greater than or equal to the projection area of the connection layer, which may be expressed as a width of the insulation layer in the first direction being greater than or equal to a width of the connection layer in the first direction, and the width of the insulation layer in the second direction being greater than or equal to the width of the connection layer in the second direction.

In some embodiments, the connection layer has a rectangular, circular, elliptical, or irregular projection on the substrate 100.

In this embodiment, the rectangular, circular, elliptical, or irregular connection layer is used to allow the current collection range to be wider. The connection layer has a projection on the substrate 100, and two ends of the projection in the second direction are connected to two ends of the disconnected gate line respectively. Therefore, the connection layer can form a conductive channel for two ends of the disconnected gate line.

It should be noted that the connection layer can have a rectangular, circular, elliptical, or irregular projection on the substrate 100.

The rectangular, circular, elliptical, or irregular insulation layer can separate the gate electrode from the connection layer, conductive layer, and disconnected gate line below the insulation layer.

It can be understood that the projection area of the insulation layer on the substrate 100 is greater than or equal to the projection area of the connection layer on the substrate 100, and the insulation layer and the connection layer can be of the same shape or different shapes.

In some embodiments, at the intersection, a width of the connection layer in the second direction is greater than or equal to a distance by which the gate line is disconnected.

In this embodiment, when the width of the connection layer in the second direction is equal to the distance by which the gate line is disconnected, two ends of the connection layer are in contact with disconnected two ends of the gate line, and the disconnected gate line is connected to form a conductive channel. Therefore, the conductive metal used for preparing the connection layer is small, and the manufacturing cost of the solar cell is low.

When the width of the connection layer in the second direction is greater than the distance by which the gate line is disconnected, the two ends of the connection layer cover the disconnected two ends of the gate line. In this way, a contact area between the connection layer and the gate line is increased, which can increase a carrier collection range of the connection layer and improve the photoelectric conversion efficiency of the solar cell.

Figure 6:
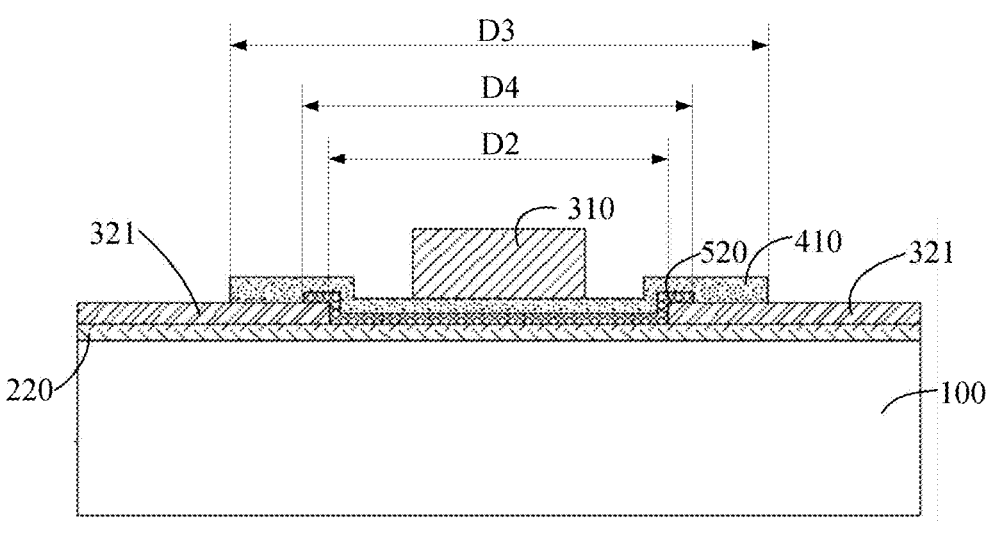
FIG. 6 is a fourth sectional view of an intersection of a back contact solar cell according to an embodiment of the present disclosure.

For example, as shown in FIG. 6, at the intersection, a width of the second connection layer 520 in the second direction is D4, and a distance by which the gate line is disconnected is D2. D4 is greater than D2. Two ends of the second connection layer 520 cover two disconnected ends of the second gate line 321. A contact area between the second connection layer 520 and the second gate line 321 is large, which allows a carrier collection range of the second connection layer 520 to be wide and the photoelectric conversion efficiency of the solar cell to be improved.

In this embodiment, a projection area of the first insulation layer 410 is greater than a projection area of the second connection layer 520. The width of the first insulation layer 410 in the second direction is D3, and the width of the second connection layer 520 in the second direction is D4. D3 is larger than D4. The first insulation layer 410 may cover the second connection layer 520, which can improve the insulation effectiveness between the gate electrode and the connection layer and avoid the short circuit of the solar cell.

In some embodiments, at the intersection, the width of the connection layer in the second direction is greater than or equal to the distance by which the gate line is disconnected, and the width of the insulation layer in the second direction is greater than or equal to the width of the connection layer in the second direction.

It can be understood that, for the intersection where the gate line insects the gate electrode with opposite electric polarities in the back contact solar cell, at least one of the following modes can be set.

First, the insulation layer is arranged between the conductive layer and the gate electrode at the intersection where the conductive layer intersects the gate electrode, and the disconnected gate line is electrically connected through the conductive layer.

Second, the insulation layer and the connection layer are arranged between the conductive layer and the gate electrode at the intersection where the conductive layer intersects the gate electrode. The insulation layer is close to the gate electrode, and the connection layer is close to the conductive layer. The square resistance of the connection layer is smaller than the square resistance of the conductive layer. The disconnected gate line is formed as a conductive channel through the connection layer, and the insulation layer separates the connection layer from the gate electrode.

In some embodiments, the connection layer and the conductive layer are arranged at the intersection at two opposite sides of the back contact solar cell in the second direction.

The two opposite sides in the second direction refer to positions of the two outermost gate electrodes in the second direction on the back contact solar cell.

For example, as shown in FIG. 1, the gate electrodes of the back contact solar cell are arranged from left to right in the second direction. Adjacent gate electrodes have opposite electric polarities.

In this embodiment, the two opposite sides in the second direction are the first gate electrode 310 located at the leftmost side of the back contact solar cell and the second gate electrode 320 located at the rightmost side of the back contact solar cell. An intersection corresponding to the outermost first gate electrode 310 and the second gate electrode 320 is provided with the connection layer and the conductive layer.

It should be noted that current collected by a gate line at the intersection is transmitted to an adjacent gate electrode in the second direction. For the gate line located at the outermost gate electrode, current is transmitted to an adjacent gate electrode at a side. The current loss caused by the transmission of the conductive layer is relatively large, which may cause the efficiency of the solar cell to decrease. After the connection layer is arranged, the connection layer with low square resistance forms a conductive channel between the disconnected gate lines. The current transmission can be equivalent to a case where the two ends of the gate line are not disconnected. In this way, the current loss between the disconnected gate lines is small or no additional current loss is achieved, and the efficiency of the solar cell is effectively improved.

In some embodiments, the conductive layer is arranged at the intersection in a middle of the back contact solar cell in the second direction.

The middle of the back contact solar cell refers to gate electrode positions distributed in the second direction on the back contact solar cell except for the outermost two gate electrodes.

For example, as shown in FIG. 1, the gate electrodes of the back contact solar cell are arranged from left to right in the second direction. Adjacent gate electrodes have opposite electric polarities.

In this embodiment, the middle of the back contact solar cell in the second direction is gate electrode positions excluding the outermost first gate electrode 310 and the second gate electrode 320, including positions of the middle four gate electrodes.

The intersection of the second gate electrode 320 and the first gate line 311 in the middle of the back contact solar cell is provided with the second insulation layer 420. As shown in FIG. 3, the disconnected first gate line 311 is electrically connected through the first conductive layer 210.

The intersection of the first gate electrode 310 and the second gate line 321 in the middle of the back contact solar cell is provided with the first insulation layer 410. As shown in FIG. 5, and the disconnected second gate line 321 is electrically connected through the second conductive layer 220.

It should be noted that the current collected by the gate line at the intersection is transmitted to the adjacent gate electrodes in the second direction. For the gate line at a position where the gate electrode is located at the middle of the back contact solar cell, the current can be transmitted to the adjacent gate electrodes at two sides. Therefore, the current loss is small, and an impact of the disconnected gate line on the solar cell efficiency is small. The connection layer can not be arranged at middle of the back contact solar cell, allowing the manufacturing cost of the solar cell to be effectively reduced on the premise of not greatly affecting the efficiency of the solar cell.

In some embodiments, the connection layer and the conductive layer are disposed at the intersection in the middle of the back contact solar cell in the second direction.

In this embodiment, the connection layer is arranged at the intersection. The connection layer with lower square resistance forms a conductive channel between the disconnected gate lines. The current transmission can be equivalent to the case where the two ends of the gate line are not disconnected. Through the arrangement of the conductive layer and the connection layer, the current loss can be effectively reduced and the solar cell efficiency can be improved.

In actual implementation, the connection layer may be disposed at the intersection corresponding to the outermost two gate electrode positions of the back contact solar cell. The connection layer may be disposed at the gate electrode position of the middle of the back contact solar cell, or the connection layer may not be disposed at the gate electrode position of the middle of the back contact solar cell.

It can be understood that the electrode structure of the back contact solar cell is located at a shady surface, and a heterojunction (HJT) structure can be formed in the back contact solar cell. Therefore, the back contact solar cell combines an excellent passivation effect and a high disconnected voltage advantage of the HJT solar cell, and a passivation contact structure can further be arranged at the back contact solar cell, which allows the back contact solar cell to combine carrier selection and passivation contact characteristics of a TOPConsolar cell, and improves the photoelectric conversion efficiency of the solar cell.

In some embodiments, the substrate 100 includes a doped semiconductor layer, a passivation layer, and a semiconductor substrate 101 sequentially arranged in a direction away from the conductive layer.

The doped semiconductor layer includes doped polysilicon, doped amorphous silicon, doped nanocrystalline silicon, or doped microcrystalline silicon. The passivation layer includes tunneling oxide or intrinsic amorphous silicon.

When the passivation layer is tunnel oxide and the doped semiconductor layer is doped polysilicon, a TOPCon structure can be formed. When the passivation layer is intrinsic amorphous silicon and the doped semiconductor layer is doped amorphous and/or microcrystalline silicon, an HJT structure can be formed.

In this embodiment, the electrode structure of the back contact solar cell is located at the shady surface. By arranging the TOPCon structure (e.g., the first passivation layer 111 is tunnel oxide and the first doped semiconductor layer 112 is doped polysilicon) and the HJT structure (e.g., the second passivation layer 121 is intrinsic amorphous silicon and the second doped semiconductor layer 122 is doped amorphous and/or microcrystalline silicon), the efficiency of the solar cell can be effectively improved and the process complexity can be reduced. The back contact solar cell belongs to a hybrid back contact solar cell (Hybrid BC).

In some embodiments, the electrode structure of the back contact solar cell is located at the shady surface. The efficiency of the solar cell is effectively improved by configuring a heterojunction structure (e.g., the first passivation layer 111 and the second passivation layer 121 are intrinsic amorphous silicon, and the first doped semiconductor layer 112 and the second doped semiconductor layer 122 are amorphous and/or microcrystalline silicon with opposite doping types). The back contact solar cell belongs to a heterojunction back contact solar cell (HJT-BC).

In actual implementation, when the electrode structure is prepared by HJT metallization of the back contact solar cell, the low-temperature silver paste can be printed by silk-screen printing method and sintered at about 200° C.

The silver powder used in the low temperature silver paste is mostly a mixture of flake silver powder and spherical silver powder. The flake silver powder has a large size span, and the large particles lead to the final gate line with rough morphology, large height fluctuation, and many spikes.

In this embodiment, at the intersection where the gate electrode intersects the gate line of the opposite electric polarities, the gate line is disconnected and spaced apart from the gate electrode in the second direction. For the gate line formed by the low temperature silver paste, possible spikes in the gate line can be effectively avoided piercing the insulation layer and forming an electrical connection with the gate electrode with opposite electric polarities, thereby avoiding the solar cell being ineffective due to the short circuit.

In addition, when the gate line is disconnected at the intersection, a height difference at the intersection of the gate electrode and the gate line of different electric polarities can be reduced, which is convenient for solar cell testing and serial welding. The reduced height difference can reduce the silver paste consumption of the electrode structure and reduce the manufacturing cost of the solar cell.

The shady surface of the back contact solar cell forms two types of polarity regions with opposite electric polarities and corresponding two types of electrode structures with opposite electric polarities, each type of polarity region includes the passivation layer, the doped semiconductor layer, and the conductive layer. A front surface of the back contact solar cell may further be provided with a third passivation layer 130 and an anti-reflection layer 140. The anti-reflection layer 140 is configured to improve the absorption rate and conversion rate of sunlight inside the solar cell.

Figure 9:
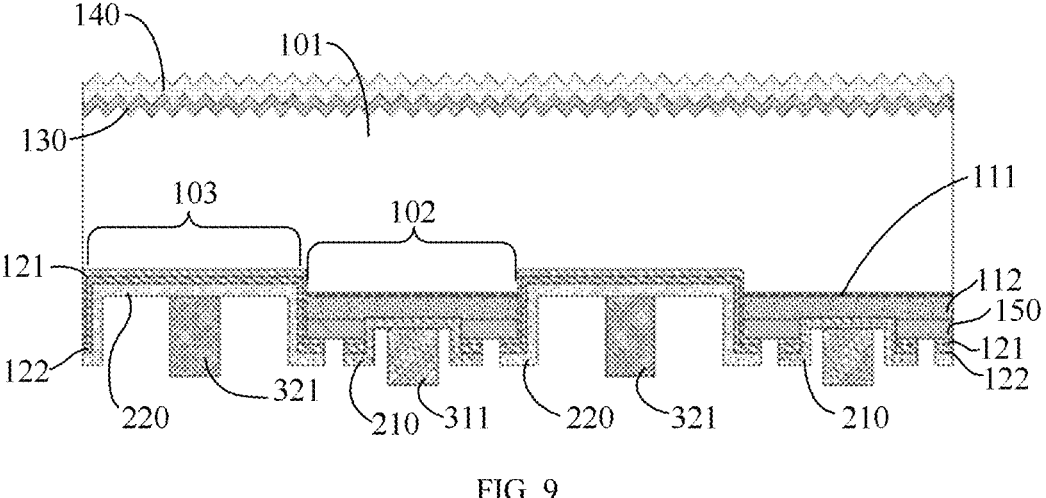
FIG. 9 is a sectional view of a back contact solar cell in a first direction according to an embodiment of the present disclosure.

For example, as shown in FIG. 9, the shady surface forms a first polarity region 102 and a second polarity region 103 arranged at intervals in the second direction. The first polarity region 102 includes the first passivation layer 111, the first doped semiconductor layer 112, and the first conductive layer 210. The first gate line 311 of the first electrode structure is disposed at the first polarity region 102, and the second polarity region 103 includes the second passivation layer 121. The second gate line 321 of the second electrode structure is disposed at the second polarity region 103.

The first passivation layer 111 includes tunnel oxide or intrinsic amorphous silicon. The first doped semiconductor layer 112 includes doped polysilicon or doped amorphous silicon (amorphous silicon may also be replaced by nanocrystalline silicon or microcrystalline silicon). The second passivation layer 121 includes intrinsic amorphous silicon. The second doped semiconductor layer 122 includes doped amorphous silicon (amorphous silicon may also be replaced by nanocrystalline silicon or microcrystalline silicon).

It can be understood that the two types of doped semiconductor layers are located in different polarity regions. A doping type of the first doped semiconductor layer 112 is the same as or opposite to a doping type of the semiconductor substrate 101. A doping type of the second doped semiconductor layer 122 is opposite to the doping type of the first doped semiconductor layer 112.

As shown in FIG. 9, the first conductive layer 210 is electrically insulated from the second conductive layer 220. An isolated opening may be formed between the first conductive layer 210 and the second conductive layer 220 to achieve electrical insulation.

In actual implementation, the passivation layer and the doped semiconductor layer form a hierarchical structure for transmitting carriers. The hierarchical structures for transmitting different carriers may not overlap, or a partially overlapping region may be set.

It can be understood that the different polarity regions transmit different carriers, and the overlapping region of the hierarchical structures for transmitting different carriers can be provided with an insulating material layer 150 to separate the different hierarchical structures.

For example, as shown in FIG. 9, the overlapping region exists between the first passivation layer 111, the first doped semiconductor layer 112, the second passivation layer 121, and the second doped semiconductor layer 122. The insulating material layer 150 exists between the first passivation layer 111, the first doped semiconductor layer 112, the second passivation layer 121, and the second doped semiconductor layer 122 in the overlapping region.

In actual implementation, the insulating material layer 150 includes at least one of phosphosilicate glass, borosilicate glass, silicon oxide, silicon nitride, silicon oxynitride, and aluminum oxide.

The embodiments of the present disclosure further provide a photovoltaic module.

The photovoltaic module includes at least one back contact solar cell as described above.

Multiple back contact solar cells can be connected in series or in parallel.

According to the photovoltaic module of the embodiments of the present disclosure, in the back contact solar cell of the photovoltaic module, the gate line is disconnected and the insulation layer is arranged at the intersection where the gate electrode intersects to the gate line having opposite electric polarities, which allows the gate line to be spaced apart from the gate electrode. The disconnected gate line is electrically connected by the conductive layer to prevent electrodes having different polarities from contacting each other to cause a short circuit and prevent the solar cell from being ineffective. Meanwhile, the consumption of raw materials for electrode preparation can be reduced, and the manufacturing cost of the solar cell can be reduced.

Terms such as "first", "second", and the like in detailed descriptions of the embodiments and the claims of the present disclosure are used only to distinguish between similar objects, rather than implying a particular sequence of the objects. It should be understood that the terms may be interchanged where appropriate, to enable the embodiments of the present disclosure described herein to be implemented in an order other than that illustrated or described herein. Objects distinguished by "first," "second," etc. are generally of one type and do not limit the number of objects. For example, the first object may be one or more. In addition, "and/or" in the description and claims indicates at least one of the connected objects. The character "/" generally indicates that the associated objects before and after the character are in an "or" relationship.

In the description of the present disclosure, it should be understood that the orientation or position relationship indicated by the terms such as "length", "width", "thickness", "upper", "lower", "front", "rear", "left", "right", "top", "bottom", "inner", and "outer" should be construed to refer to the orientation or the position as shown in the drawings, and is only for the convenience of describing the present disclosure and simplifying the description, rather than indicating or implying that the pointed apparatus or element must have a specific orientation, or be constructed and operated in a specific orientation, and therefore cannot be understood as a limitation of the present disclosure.

In the description of the present disclosure, "first feature" and "second feature" includes one or more such features.

In the description of the present disclosure, "multiple" means two or more.

In the description of the present disclosure, the first feature "on" or "under" the second feature may mean that the first feature is in direct contact with the second feature, or that the first feature and the second feature are in indirect contact through another feature between them.

In the description of the present disclosure, the first feature "above" the second feature means that the first feature is directly above and obliquely above the second feature, or simply means that the level of the first feature is higher than that of the second feature.

In the description of this specification, description with reference to the terms "an embodiment", "some embodiments", "exemplary embodiments", "examples" "specific examples", or "some examples" etc., mean that specific features, structure, materials or characteristics described in conjunction with the embodiment or example are included in at least one embodiment or example of the present disclosure. In this specification, the schematic representations of the above terms do not necessarily refer to the same embodiment or example. Moreover, the described specific features, structures, materials or characteristics may be combined in any one or more embodiments or examples in a suitable manner.

Although embodiments of the present disclosure have been illustrated and described, it should be understood by those of ordinary skill in the art that various changes, modifications, replacements, and variations can be made to these embodiments without departing from the principles and spirit of the present disclosure. The scope of the present disclosure shall be defined by the claims as appended and their equivalents.

What is claimed is:

1. A back contact solar cell, comprising:
a substrate;
a plurality of conductive layers arranged at a surface of the substrate in a first direction, two adjacent conductive layers of the plurality of conductive layers having opposite electric polarities and being electrically insulated from each other; and
an electrode structure arranged at a surface of each of the plurality of conductive layers away from the substrate, the electrode structure comprising a plurality of gate electrodes and a plurality of gate lines intersecting with and electrically connected to the plurality of gate electrodes, respective gate electrodes with opposite electric polarities being arranged at intervals in a second direction intersecting with the first direction, wherein a gate line of the plurality of gate lines intersects with a gate electrode of the plurality of gate electrodes that has opposite electric polarities to the gate line at an intersection where the gate line is disconnected to be spaced apart from the gate electrode in the second direction, the disconnected gate line being electrically connected by a conductive layer of the plurality of conductive layers having the same electric polarity as the disconnected gate line, and a plurality of insulation layers being disposed between the plurality of gate electrodes and the respective conductive layers at the intersections.

2. The back contact solar cell according to claim 1, wherein at the intersections, a width of each of the plurality of insulation layers in the second direction is greater than or equal to a width of a corresponding gate electrode in the second direction.

3. The back contact solar cell according to claim 1, wherein at the intersections, the gate line is disconnected by a distance greater than a width of the gate electrode in the second direction.

4. The back contact solar cell according to claim 1, wherein at the intersections, a width of each of the plurality of insulation layers in the second direction is greater than or equal to a distance by which the gate line is disconnected.

5. The back contact solar cell according to claim 1, wherein each of the plurality of conductive layers has a square resistance ranging from 20 ohm/sq to 1000 ohm/sq.

6. The back contact solar cell according to claim 1, wherein a connection layer is disposed at each of the intersections and close to the conductive layer of the plurality of conductive layers having the same electric polarity as the disconnected gate line, the connection layer having a smaller square resistance than the conductive layer, the disconnected gate line forming a conductive channel through the connection layer, and the connection layer being spaced apart from the gate electrode by a corresponding insulation layer of the plurality of insulation layers.

7. The back contact solar cell according to claim 6, wherein an area of a projection of each of the plurality of insulation layers on the substrate is greater than or equal to an area of a projection of the connection layer on the substrate.

8. The back contact solar cell according to claim 6, wherein at the intersections, a width of the connection layer in the second direction is greater than or equal to a distance by which the respective gate line is disconnected.

9. The back contact solar cell according to claim 1, wherein a connection layer and the conductive layer are disposed at each of the intersections at each of two opposite ends of the back contact solar cell in the second direction, the two opposite ends of the back contact solar cell in the second direction referring to positions of two outermost gate electrodes in the second direction on the back contact solar cell.

10. The back contact solar cell according to claim 1, wherein:
the conductive layer is disposed at each of the intersections at a center section of the back contact solar cell in the second direction; or
a connection layer and the conductive layer are disposed at each of the intersections at the center section of the back contact solar cell in the second direction.

11. The back contact solar cell according to claim 6, wherein the connection layer comprises a conductive metal.

12. The back contact solar cell according to claim 11, wherein the conductive metal is silver and/or copper.

13. The back contact solar cell according to claim 11, wherein the conductive metal is of at least one of nano-, submicron-, and micro-sized.

14. The back contact solar cell according to claim 6, wherein the square resistance of the connection layer ranges from 0.001 ohm/sq to 10 ohm/sq.

15. The back contact solar cell according to claim 6, wherein the connection layer has a rectangular, circular, elliptical, or irregular projection on the substrate.

16. The back contact solar cell according to claim 1, wherein the substrate comprises a doped semiconductor layer, a passivation layer, and a semiconductor blank that are sequentially arranged in a direction away from the plurality of conductive layers.

17. A photovoltaic module, comprising at least one back contact solar cell, wherein each of the at least one back contact solar cell comprises:

a substrate;

a plurality of conductive layers arranged at a surface of the substrate in a first direction, two adjacent conductive layers of the plurality of conductive layers having opposite electric polarities and being electrically insulated from each other; and an electrode structure arranged at a surface of each of the plurality of conductive layers away from the substrate, the electrode structure comprising a plurality of gate electrodes and a plurality of gate lines intersecting with and electrically connected to the plurality of gate electrodes, respective gate electrodes with opposite electric polarities being arranged at intervals in a sec-ond direction intersecting with the first direction, respective gate lines with opposite electric polarities being arranged at intervals in the first direction, wherein a gate line of the plurality of gate lines intersects with a gate electrode of the plurality of gate electrodes that has opposite electric polarities to the gate line at an intersection where the gate line is disconnected to be spaced apart from the gate electrode in the second direction, the disconnected gate line being electrically connected by a conductive layer of the plurality of conductive layers having the same electric polarity as the disconnected gate line, and a plurality of insulation layers being disposed between the plurality of gate electrodes and the respective conductive layers at the intersections.

18. The photovoltaic module according to claim 17, wherein at the intersections, a width of each of the plurality of insulation layers in the second direction is greater than or equal to a width of a corresponding gate electrode in the second direction.

19. The photovoltaic module according to claim 17, wherein at the intersections, the gate line is disconnected by a distance greater than a width of the gate electrode in the second direction.

20. The photovoltaic module according to claim 17, wherein at the intersections, a width of each of the plurality of insulation layers in the second direction is greater than or equal to a distance by which the gate line is disconnected.

* * * * *